United States Patent [19]
Chishima et al.

[11] Patent Number: 5,179,343
[45] Date of Patent: Jan. 12, 1993

[54] APPARATUS FOR CHECKING THE CONNECTION BETWEEN MALE AND FEMALE CONNECTOR HOUSINGS BY FORMING A DETECTING CIRCUIT WHEN THE CONNECTION IS PROPER

[75] Inventors: Masamitsu Chishima, Suzuka; Taizou Hisada, Narashino, both of Japan

[73] Assignee: Sumitomo Wiring Systems, Ltd., Mie, Japan

[21] Appl. No.: 750,997

[22] Filed: Aug. 28, 1991

[30] Foreign Application Priority Data

Sep. 6, 1990 [JP] Japan .................. 2-236221

[51] Int. Cl.⁵ .................. G01R 31/04; H01R 4/58
[52] U.S. Cl. .................. 324/538; 340/687; 439/89
[58] Field of Search .............. 324/508, 538, 724, 133; 340/652, 654, 686, 687; 439/86, 89, 90

[56] References Cited

U.S. PATENT DOCUMENTS

| | | | |
|---|---|---|---|
| 4,082,404 | 4/1978 | Flatt | 439/89 |
| 4,849,743 | 7/1989 | Ohno | 340/687 |
| 5,034,723 | 7/1991 | Maman | 340/687 |

Primary Examiner—Gerard R. Strecker
Assistant Examiner—Diep Do
Attorney, Agent, or Firm—Sughrue, Mion, Zinn, Macpeak & Seas

[57] ABSTRACT

An apparatus, accommodated in a connector, for checking whether or not a pair of connector housings of the connector has been engagedly connected with each other comprising a conductive section, made of a conductive material, provided in one of the connector housings; and a pair of detecting terminals provided in the other connector housing. When the pair of the connector housings contact with each other, the pair of the detecting terminals contact the conductive section.

1 Claim, 2 Drawing Sheets

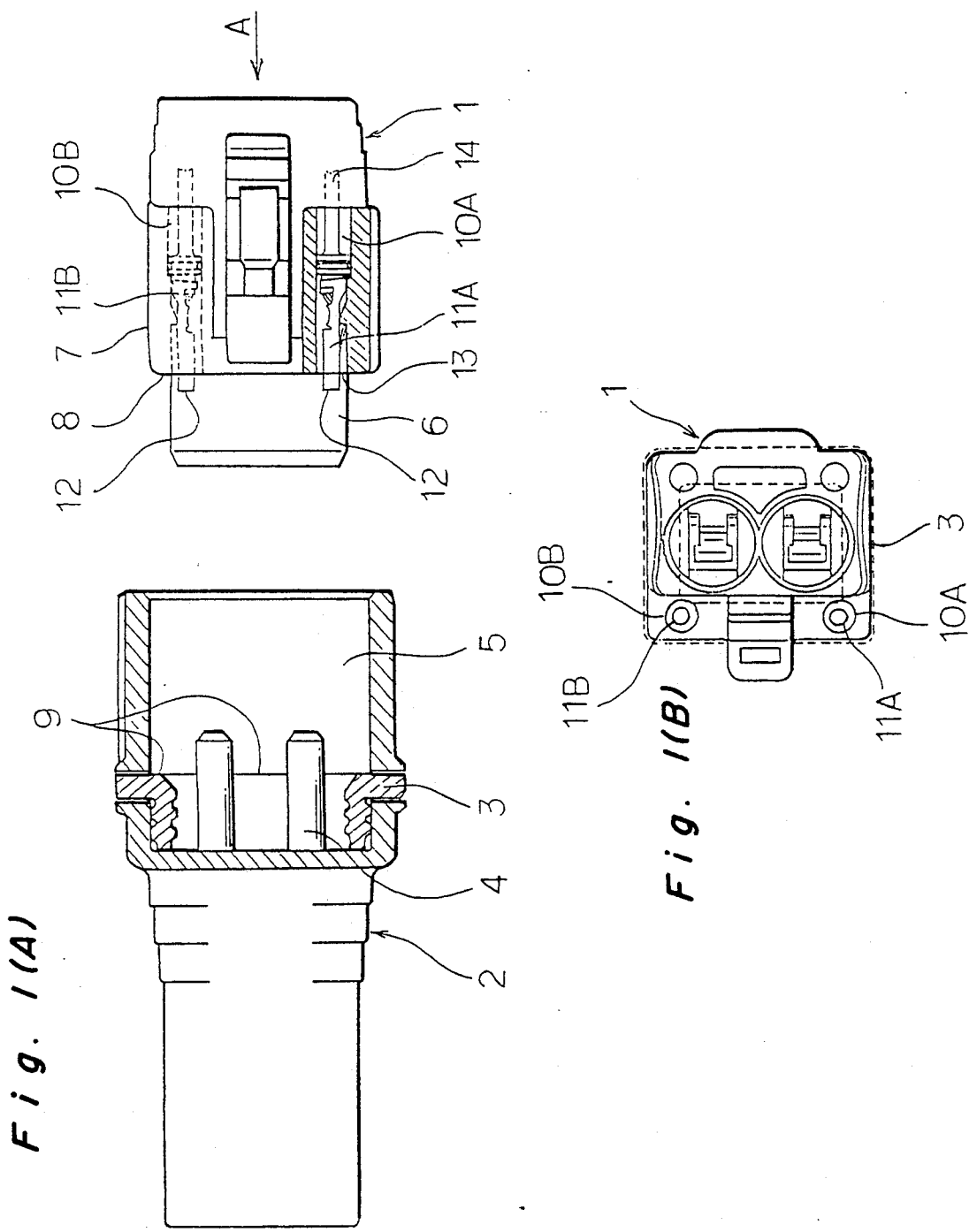

APPARATUS FOR CHECKING THE CONNECTION BETWEEN MALE AND FEMALE CONNECTOR HOUSINGS BY FORMING A DETECTING CIRCUIT WHEN THE CONNECTION IS PROPER

BACKGROUND OF THE INVENTION

1. Field of the Invention

The present invention relates to an apparatus for checking whether or not a pair of connector housings of a connector has been engagedly connected with each other.

2. Description of the Related Arts

Frictional force generated between male and female terminals of a pair of connector housings may cause the connector housings to be engagedly connected with each other at a predetermined position. That is, one of the connector housings is prevented from being inserted a predetermined amount into the other connector housing. In particular, in the case of a waterproof connector in which a seal ring is mounted in the engaging portion of connector housings, the connector housings are required to be engagedly connected with each other against the resistance of the seal ring applied thereto in addition to the frictional force generated between a pair of terminals. Thus, waterproof connectors are often unconductive due to an inaccurate connection of the terminals.

Conventionally, it depends on an operator's feeling whether or not one connector housing has been fitted into the other connector housing at a correct position. Therefore, a connector incorporated in a wire harness is often defective due to the unfavorable connection between a pair of terminals.

SUMMARY OF THE INVENTION

It is therefore an object of the present invention to provide an apparatus for reliably checking whether or not a pair of connector housings of a connector have been engagedly connected at a predetermined position.

In accomplishing these and other objects, there is provided an apparatus, provided in a connector, for checking whether or not a pair of connector housings of the connector has been engagedly connected with each other comprising: a conductive section, made of a conductive material, provided in one of the connector housings; and a pair of detecting terminals provided in the other connector housing. A detecting circuit comprising the pair of the detecting terminals and the conductive section is formed by the contact between the pair of the detecting terminals and the conductive section when the pair of the connector housings contact with each other.

According to the apparatus, when one of a pair of the connector housings has been fitted into the other connector housing, the conductive portion of one connector housing contacts the pair of the detecting terminals of the other connector housing, thus forming the detecting circuit. Therefore, whether both connector housings have been engagedly connected or not can be accurately checked by examining whether or not the detecting circuit is electrically conductive or not.

BRIEF DESCRIPTION OF THE DRAWINGS

These and other objects and features of the present invention will become apparent from the following description taken in conjunction with the preferred embodiments thereof with reference to the accompanying drawings, in which:

FIG. 1A is a front view showing an apparatus for checking the connection between connector housings of a connector according to an embodiment of the present invention;

FIG. 1B is a side elevation, of the apparatus shown in FIG. 1, taken along the arrow (A) of FIG. 1A.

DETAILED DESCRIPTION OF THE INVENTION

Figure 2A:
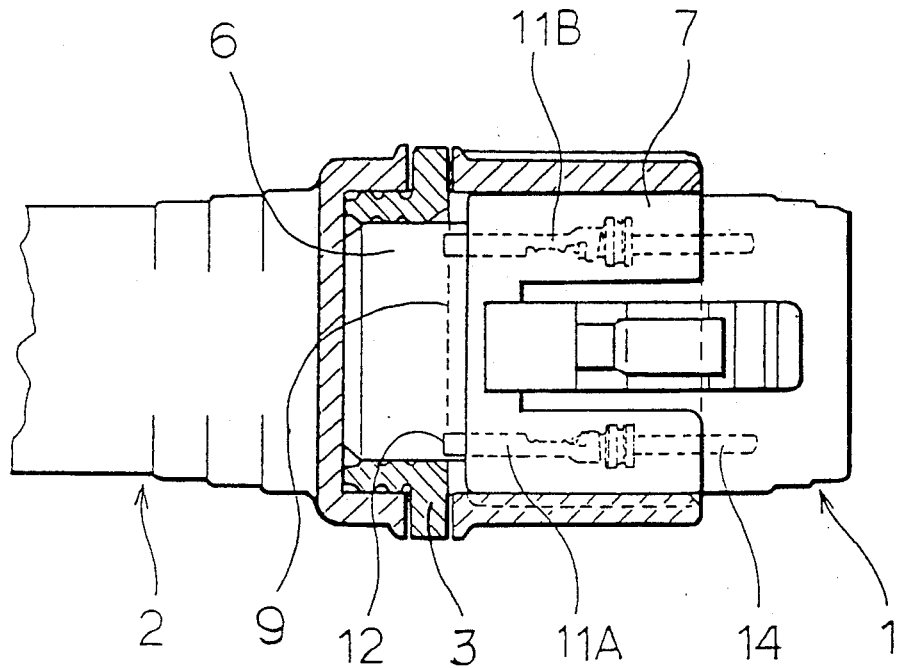
FIG. 2A and 2B are front views showing the connected condition of the apparatus shown in FIG. 1.

Before the description of the present invention proceeds, it is to be noted that like parts are designated by like reference numerals throughout the accompanying drawings.

Referring to the accompanying drawings, the embodiments of the present invention are described below.

Figure 2B:
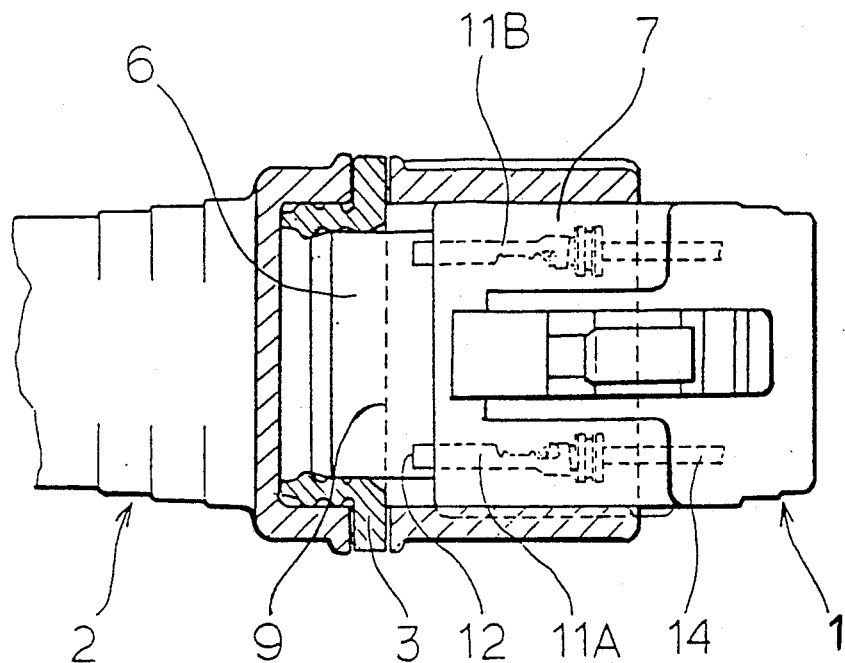

FIGS. 1 and 2 show an apparatus, provided in a connector, for checking whether or not one of connector housings of the connector has been engagedly connected according to the present invention. The apparatus of the embodiment is accommodated in a waterproof connector having a seal ring 3 serving as a detecting/conductive section.

The apparatus comprises a female connector housing 1 accommodating a female terminal not shown and a male connector housing 2 accommodating a male terminal 4. An engaging concave 5 is mounted in the front portion of the male housing 2 and a rectangular solid seal ring 3 is annularly mounted in the inner periphery of the vicinity of the bottom of the concave 5. A seal ring mounting section 6 positioned in the front portion of the female housing 1 is fitted into the concave 5. A seal ring 3 is mounted under pressure between the periphery of the seal ring mounting section 6 of the female housing 1 and the inner periphery of the concave 5 of the male housing 2. Thus, the female housing 1 and the male housing 2 of the waterproof connector are engagedly connected with each other.

The seal ring 3 mounted in the male housing 2 is made of conductive rubber. The seal ring mounting section 6 has a step 8 positioned in the front end of the main body 7 of the female housing 1. When the female housing 1 and the male housing 2 are engagedly connected, the step is brought into contact with the front edge 9 of the seal ring 3 of the male housing 2.

There is provided in the main body 7 of the female housing 1 a pair of openings 10A and 10B, for inserting detecting terminals 11A and 11B, extending in parallel with each other from the rear portion of the main body 7 to an opening 13 formed at the step 8 formed at the front end of the main body 7. The detecting terminals 11A and 11B are inserted into the openings 10A and 10B, respectively. The contact portions 12 positioned in the forward end of the detecting terminals 11A and 11B project a small amount from the step 8 so that the contact portions 12 contact the front edge 9 of the seal ring 3 of the male housing 1. A detecting cord 14 provided at the backward end of each of the terminals 11A and 11B extends outside the female housing 1 so that the detecting cord 14 is engagedly connected with a checking section (not shown) comprising a detecting lamp/alarm.

When the female housing 1 and the male housing 2 are engagedly connected with each other, i.e., when the former is fitted into the latter at a normal position thereof and both take a correct posture, the contact portions 12 of the terminals 11A and 11B contact the forward edge 9 of the seal ring 3 and is electrically conductive with the seal ring 3. That is, the terminals 11A and 11B and the seal ring 3 having a detecting/conductive function constitute the principal portion of the apparatus.

Referring to FIG. 2, when the female housing 1 and the male housing 2 are engagedly connected with each other, the contact portions 12 of the terminals 11A and 11B contact the forward edge 9 of the seal ring 3, with the result that the terminals 11A and 11B are electrically conductive with the seal ring 3. Consequently, the seal ring 3 made of conductive rubber acts as a detecting/conductive section. Thus, a detecting circuit comprising the terminals 11A and 11B and the seal ring 3 is formed. Whether the female housing 1 and the male housing 2 have been engagedly connected with each other can be accurately detected by confirming that the detecting circuit is electrically conductive.

On the other hand, if the female housing 1 and the male housing 2 have not been engagedly connected with each other, i.e., if the female housing 1 is not inserted a predetermined amount into the male housing 2, the contact portions 12 of the terminals 11A and 11B do not reach the seal ring 3, with the result that the detecting circuit is not electrically conductive. Thus, an inaccurate connection between the two housings 1 and 2 can be detected by confirming that the detecting circuit is not electrically conductive.

The apparatus according to the present invention may be applied to an ordinary connector having no seal ring by providing the connector with a detecting/conductive section made of a conductive material in one of connector housings.

As described above, whether or not the connector housings of the connector have been engagedly connected with each other can be physically detected by the apparatus. Therefore, compared with the conventional way of checking the connection between the connector housings based on an operator's feeling, the apparatus of the present invention is much more reliable in checking the connection between the two connector housings. Further, the apparatus has a simple construction and whether or not the connector housings of the connector have been engagedly connected with each other can be repeatedly made with ease.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus, provided in a waterproof connector including a pair of connector housings to be connected to each other, for checking whether or not said pair of connector housings of said connector have been engagedly connected with each other, said pair of connector housings including a male connector housing and a female connector housing, said male connector housing including a concave portion and said female connector housing including a mounting section; said apparatus comprising:

a conductive seal ring, made of a conductive material, provided in said male connector housing; and a pair of detecting terminals provided in said female connector housing, wherein a detecting circuit comprising said detecting terminals and said conductive seal ring is formed by the contact between said detecting terminals and said conductive seal ring when said male and female connector housings contact with each other, and further wherein said conductive seal ring is mounted under pressure between an outer periphery of said mounting section of said female connector housing and an inner periphery of said concave portion of said male connector housing when said male and female connector housings are in a connected condition, to attendantly provide a waterproof connection between said male connector housing and said female connector housing.

* * * * *